United States Patent [19]

Nyman

[11] Patent Number: 5,607,313
[45] Date of Patent: Mar. 4, 1997

[54] SURFACE MOUNTED HOLES FOR PRINTED CIRCUIT BOARDS

[75] Inventor: Bengt E. Nyman, San Diego, Calif.

[73] Assignee: Autosplice Systems, Inc., San Diego, Calif.

[21] Appl. No.: 394,831

[22] Filed: Feb. 27, 1995

[51] Int. Cl.$^6$ ....................................................... H01R 9/09
[52] U.S. Cl. ........................... 439/83; 439/874; 439/876
[58] Field of Search ............................... 439/78, 83, 874, 439/876

[56] References Cited

U.S. PATENT DOCUMENTS

| | | | |
|---|---|---|---|
| 3,464,051 | 8/1969 | Webb | 439/876 X |
| 4,056,302 | 11/1977 | Braun et al. | 439/874 X |
| 4,645,288 | 2/1987 | Stursa | 439/876 X |
| 5,127,838 | 7/1992 | Zaderej et al. | 439/78 X |

*Primary Examiner*—P. Austin Bradley
*Assistant Examiner*—Daniel Wittels

[57] ABSTRACT

A method and device for improved assembly to hole-free PCBs of high aspect ratio components or any other components that are not easily assembled to a hole-free PCB by standard surface-mount technology (SMT), such as pins, lugs, tabs, and test points. A metal or other electrically conductive member having one or more holes ("holed component") is mounted to the PCB, typically on a solder pad on the PCB. The said electrically conductive member, will have a low aspect ratio. The hole, which may be round, rectangular, or threaded, is sized to provide an interference fit with the male projection of the component which will be inserted within the hole. The holed component, like other low aspect ratio SMT components, may be delivered on tape and reel and conventional surface mount or pick and place equipment is used to surface mount the holed component on the hole-free PCB, following which the holed component is soldered in place. Then, the male projections of the components can be press-fitted into the holes of one or more of such soldered holed components in the same manner as such components were previously interference fitted into the holes of PCBs, using high speed inserter machines.

17 Claims, 4 Drawing Sheets

SURFACE MOUNTED HOLES FOR PRINTED CIRCUIT BOARDS

RELATED APPLICATION

Commonly-assigned, copending, U.S. patent application, U.S. Ser. No. 084,579, filed Jun. 29, 1993, entitled "SURFACE MOUNTED PINS FOR PRINTED CIRCUIT BOARDS".

BACKGROUND OF THE INVENTION

This invention relates to methods and devices for surface mounting pins and other components with male projections to a substrate such as a printed circuit board.

The two major ways that components are attached to printed circuit boards (PCBs) are with boards that have holes in them, and boards without holes. In boards with holes typically produced by through-hole drilling or punching, a component, i.e., pin, tab, resistor, etc., is inserted via its projecting male terminal or terminals into the hole in the board and the component is held in place by an interference fit, clinch, or a spring form on a component leg. After all the components are attached, the components are subsequently wave soldered to the PCB. A problem arises that throughhole drilling or punching is associated with a relatively large hole size tolerance, which also increases the solder pad on the PCB that surrounds the hole. As boards get smaller and smaller, this hole and pad size take up too much room on the board.

In boards without holes the components are surface mounted. In this case, the pads on the surface mount board are printed (silkscreen or stencil) with solder paste and the components are placed on these solder printed pads and then the solder is reflowed. The great advantage in surface mount is that there is a potential real estate board savings of up to 70% of the area of the board.

Typical surface mount components such as resistors, capacitors, Ics, are low to the board. This means that the aspect ratio (height to width) of the component is small.

A problem arises when a tall or high aspect ratio component, i.e., test point, connector pins, relay package, needs to be surface mounted. To simply solder or re-flow a test point or pin component, besides being difficult, does not result in a very sturdy structure. Hence, the surface mounted component in field use can easily be broken off during a mating or mishandling operation. Presently, manufacturers solve this problem by having a hybrid (mixed technology) board where the components are both mounted in holes as well as surface mounted. The problem with this is that the boards become more costly with the addition of the holes and some of the real estate savings are lost. Also, separate assembly machines to insert surface mount and through-hole components are required.

Reference is also made to the above-mentioned related application, whose contents are incorporated herein by reference. That application describes machine surface mounting pins and pin headers using a conventional pick and place machine. The pins are constructed with a relatively large base so that a sturdier mounting to the PCB solder pad is obtained. That application also describes the use of special pin holders for holding the pins in pockets in a plastic tape supplied from a reel, with the pick and place machine using a vacuum or suction head to pick a component and place it, manually or as directed by a computer, into its proper place on the PCB, for subsequent soldering. The special holder not only makes it easier to use suction to pick-up the pin and transport it to the PCB, but also helps support the pin until soldered in place. Alternatively, if no holder were used, grippers could be used on the pick and place machine to lift the pin and transport it to the PCB.

A disadvantage of the schemes described in the copending application is that a pin insertion machine cannot be used to assemble the pins to the surface mounted PCB. Also, the shank of the pin is too long for many standard pick and place machines (already in service) to vacuum pick up the pin. In addition, the packaging of the pin in tape and reel format typically results in a pocket in the plastic tape that does not position the pin with sufficient accuracy for the vacuum pick up nozzle. As described in the 1989 article referenced in the related application and entitled "Six (6) Easy Enhancements of Continuous Pin and Post Terminals", delivered at the Sep. 25–28, 1989 Coil Winding Proceedings Meeting at O'Hare Exposition Center, Rosemount, Ill., whose contents are also incorporated herein by reference, known pin inserter machines are capable of high speed and high production rates. Not being able to use a conventional pin inserter machine increases substantially the cost of producing populated PCBs.

SUMMARY OF THE INVENTION

The main object of the invention is a method and device for improved assembly to hole-free PCB regions of high aspect ratio components or any other components that are not easily assembled to a hole-free PCB region by standard surface-mount technology (SMT).

A further object of the invention is a method and device for precision assembling of pins, lugs, tabs, test points, other connection assemblies, or other typical leaded components (e.g., coils, forms, relays), to a hole-free PCB region.

In accordance with one aspect of the present invention, a metal or other electrically conductive member having one or more holes is mounted on a substrate such as a PCB, typically on a solder pad on the PCB. The said electrically conductive member, which in some embodiments is similar to a washer or a nut, and in others is similar to a base with a blind or through hole and will hereinafter be referred to as a "holed component". The hole, which may be round, rectangular, or threaded, is sized to provide an interference or press fit with the male projection of the component which will be inserted within the hole. By "interference or press fit" is meant that the male component, in its largest lateral dimension, will exceed the smallest lateral dimension of the hole in the holed component by at least 0.0005 inches and preferably at least 0.001 inches.

In accordance with a further aspect of the invention, the holed component, like other low aspect ratio SMT components, can be packaged in tape and reel, in tubes, or in trays to surface mount the holed component on the hole-free PCB region or other substrate, following which the holed component is soldered in place. Then, the male projections of the components can be press-fitted into the holes of one or more of such soldered holed components in the same manner as such components were previously interference fitted into the holes of PCBs, using high speed inserter machines.

In a preferred embodiment, the holed component will have a low aspect ratio, typically less than about 0.5.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

DETAILED DESCRIPTION OF THE PREFERRED EMBODIMENTS

Figure 1A:
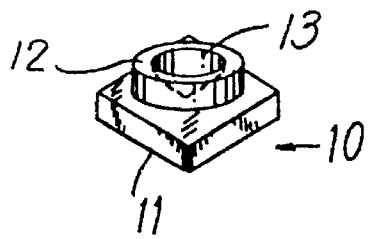
FIGS. 1A–1F are perspective views of several different forms of a single holed component in accordance with the invention.

FIGS. 1A–1E show, not to scale, several embodiments in accordance with the invention of a single holed component. In FIG. 1A, the holed component 10 comprises a rectangular base 11 having a flat bottom with an upstanding integral projection 12. A blind hole 13 extends into the projection 12 and optionally into the base 11. The hole 13 may be round, rectangular (including square) or threaded. Typical ranges of dimensions are: for the base 11, 0.060, to 0.120 inches wide, 0.030 to 0.060 inches high; for the projection 12, 0.030 to 0.060 inches high, for the hole 13, 0.010 to 0.030 inches in its smallest dimension.

Figure 1B:
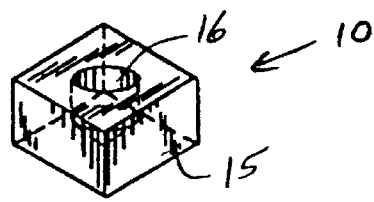
Figure 1C:
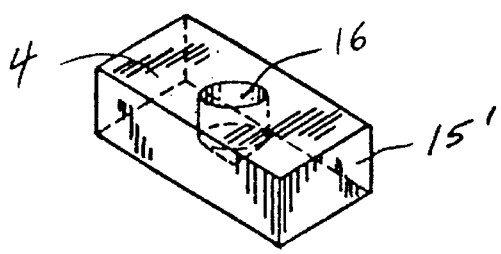

In FIG. 1B, the holed component 10 comprises a polygonal shaped block 15 with a hole 16. In FIG. 1C, the block 15' is elongated but the component is otherwise similar to that of FIG. 1B. The three embodiments of FIGS. 1A–1C are 1-piece and can be made by stamping, for example, from sheet metal.

Figure 1D:
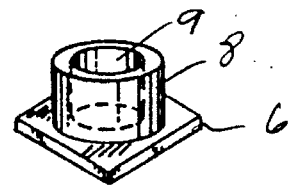
Figure 1E:
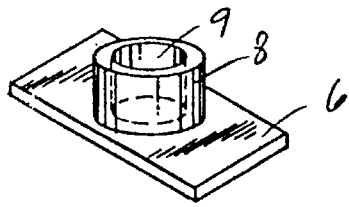
Figure 1F:
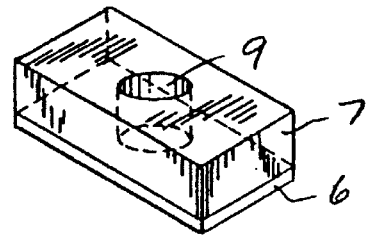

The FIGS. 1D–1F embodiments differ in that they are made from 2-pieces, a solid bottom base part 6 and an upper base 7 or projecting part 8 with a through-hole 9. The bottom base part 6 closes off the hole 9. FIGS. 1A to 1E embodiments are preferably made of metal, such as an easily solderable copper alloy, such as brass. The bottom surface of the holed components can be tinned for easy soldering. The lower base part 6 can also be made of a solderable foil, such as of tin-lead. The 2-piece structure can be made by soldering or otherwise bonding together the top and bottom parts. The bottom plate or foil 6 is needed to close off the hole 9 to maintain the suction on the vacuum pick-up of the pick and place machine when the pick-up is positioned to land over the hole 9. Such holed components will therefore have blind holes. However, when the holed component has a sufficient large solid surface area to receive the pick-up away from the hole to maintain the vacuum, such as the FIG. 1C embodiment, where the pick-up could be positioned to land on the top solid surface indicated by numeral 4, then the hole 16 can be a through-hole, meaning that it passes completely through the holed component.

Figure 2:
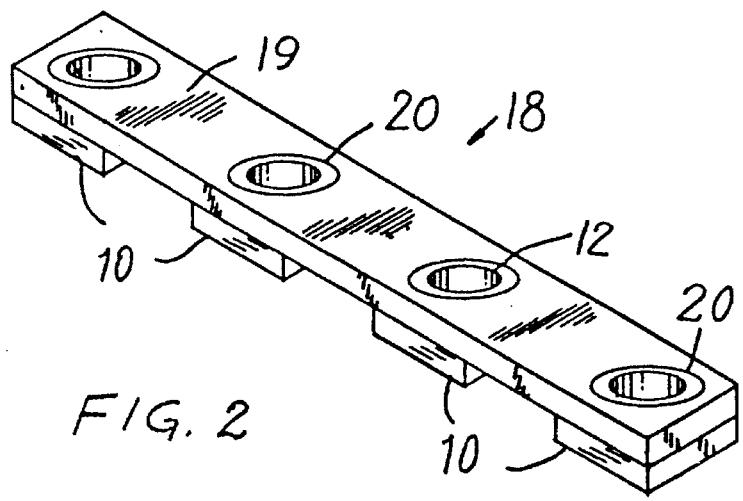
FIG. 2 is a perspective view of one form of an inline assembly of holed components in accordance with the invention.
Figure 3:
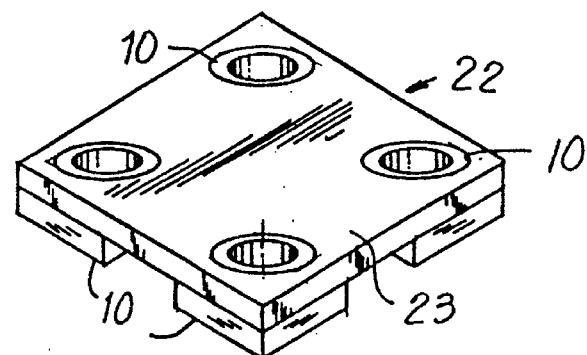
FIG. 3 is a perspective view of one form of an array of holed components in accordance with the invention.

FIG. 2 shows an integral assembly 18 of inlined holed components 10, formed by an insulating strip 19 having inlined holes 20 each of which is sized to receive and hold by an interference fit the projection 12 of a holed component 10 of FIG. 1. The projections 12 can be flush with or raised above the surface of the insulator 19. The insulator 19 maintains the holed components 10 properly spaced and electrically insulated for receiving components that may be at different electric potentials. FIG. 3 shows an assembly 22 similar to that of FIG. 2 but in an X-Y array format, comprising an insulator 23 supporting four holed components 10. Here, too, since ample solid surfaces are available on the elements 19 and 23 to receive the pick-up and maintain the vacuum, the holes 20 can also be through-holes.

Figure 4:
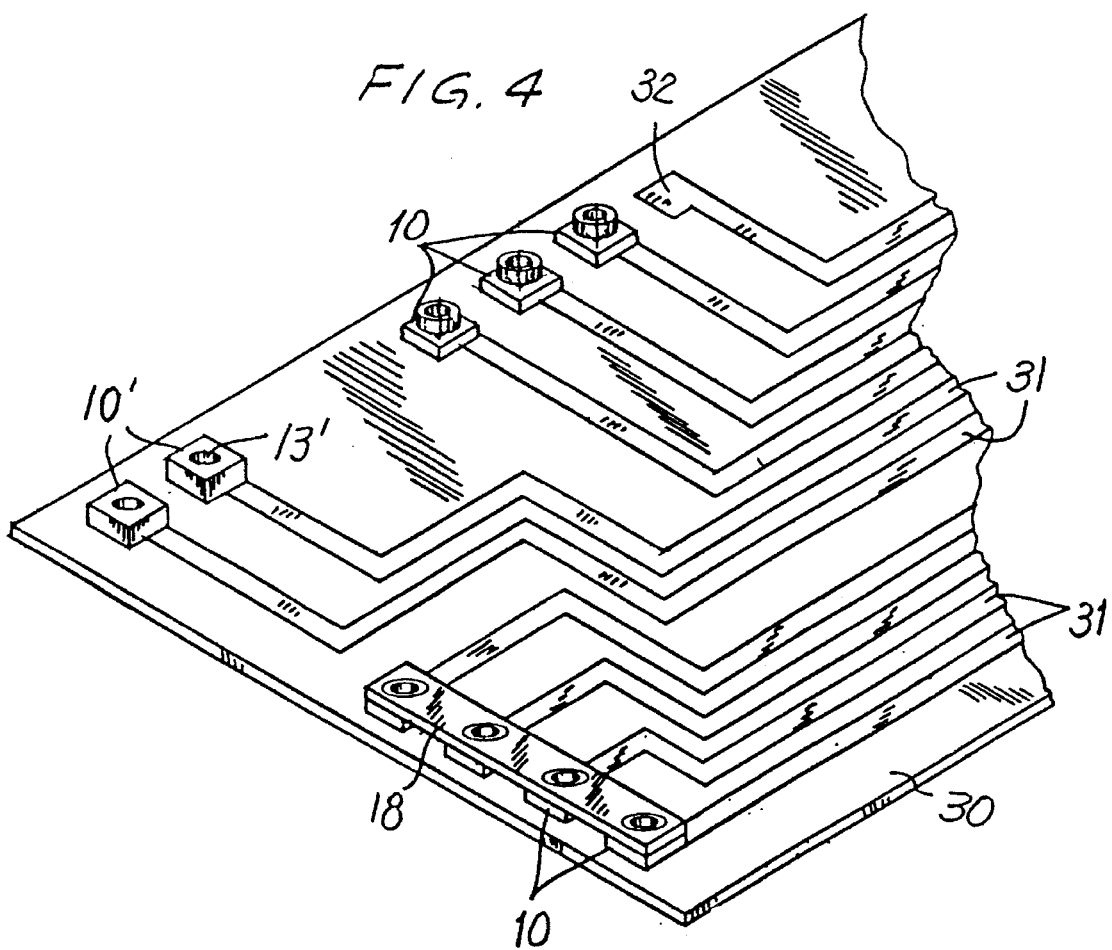
FIG. 4 is a perspective view of part of a PCB with single and inline holed components as shown in FIGS. 1 and 2 mounted in place.

FIG. 4 shows one possible end product produced by carrying out the invention. A hole-free PCB portion 30 serving as a substrate has the usual laminated and etched conductors 31 leading to other surface-mounted components (not shown) and terminating in individual solder pads, only one of which is shown at 32. To each of the not-shown solder pads is soldered a holed component. Several of the holed components 10 are shown at top. A modified form of the holed component 10' is shown at the upper left. This modified form has the shape and appearance of a nut with a threaded blind-hole 13'. At the bottom is shown an assembly 18 of inlined holed components 10. Each of the holed components 10, 10' have been soldered to the underlying solder pad (not shown) and thus is sturdily held in position establishing a reliable electrical connection to the associated conductor 31.

A unique aspect of the assembly shown in FIG. 4 is that it was machine mounted. In particular, the assembly shown in FIG. 4 can be made with a standard pick and place machine, for example, those supplied by Fuji, Panasert, Universal, Sanyo, and others, which employ a standard suction head designed to pick up components and place them on a PCB manually or in accordance with a program-controlled computer. The machines are conventionally supplied with a feeder reel of components, in this case of single holed components or multiple holed components. As illustrated in FIG. 7 of the referenced related application, on a reel is wound a plastic tape which contains a series of pockets 22 housing components. One edge of the tape is supplied with a row of sprocket holes for feeding the tape and aligning the pins with the vacuum pick-up head. The components inside the pockets are prevented from falling out by a plastic cover tape, which is peeled off during use to expose the underlying components in the pockets for access by the machine's suction head. The pick-up of the components from the tape and its alignment and placement on the PCB is conventional and need not be described in detail.

Figure 5:
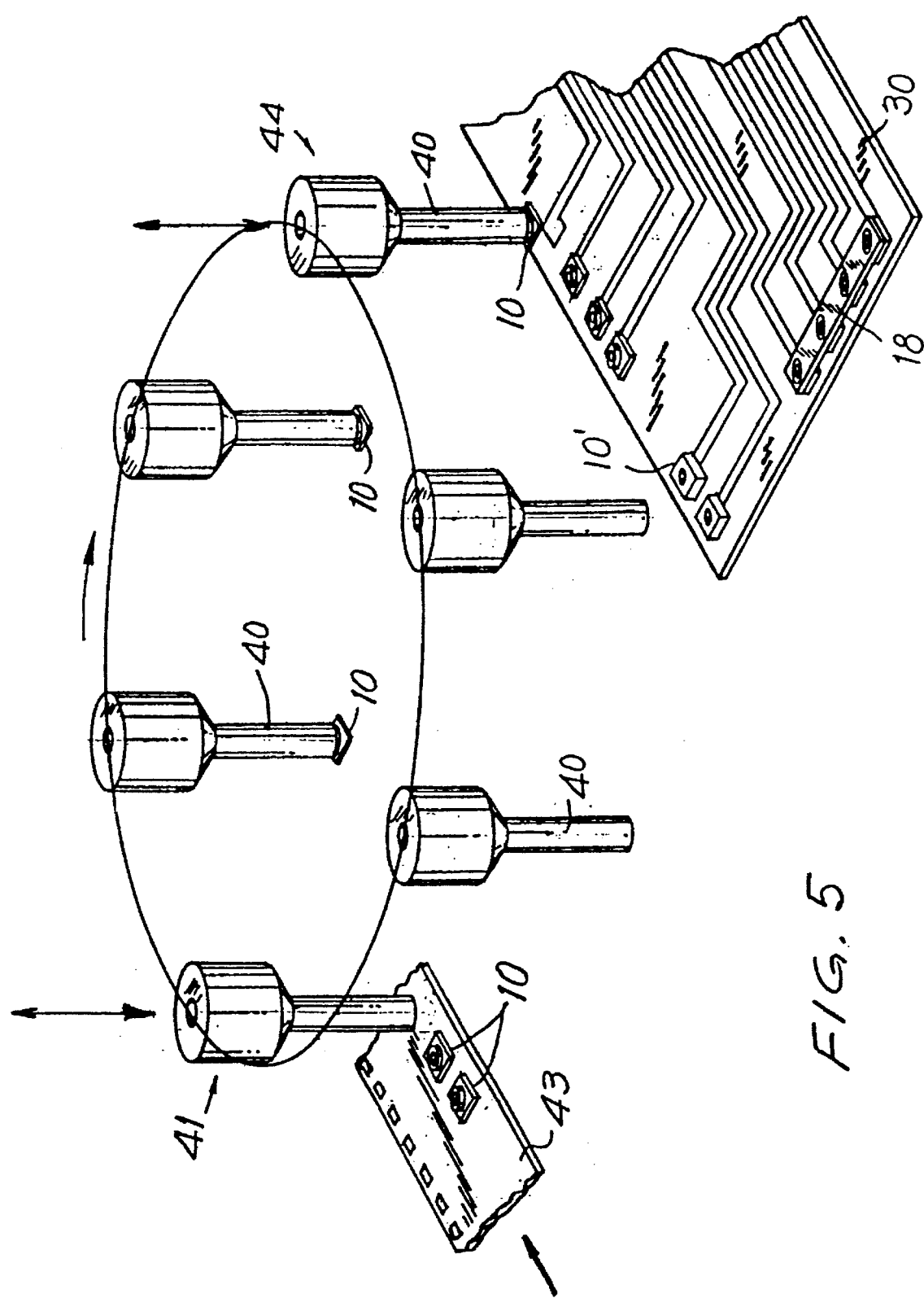
FIG. 5 schematically illustrates a pick and place head of conventional SMT equipment showing how a holed component can be placed on a PCB.

FIG. 5 schematically illustrates a pick and place head 40 of such a machine, in six different positions. In the position shown at 41, the head 40 moves down to pick up by suction a holed component 10 in a pocket (not shown) on a plastic tape 43. The component 10 is carried by the head 40 to a position 44 over the PCB 30 and then moves downward to place the holed component 10 on the designated solder pad. Releasing the vacuum releases the component. The component 10 is usually held in place on the PCB by a drop of solder paste or a suitable adhesive. The soldering of the placed components to the solder pads and traces by, for example, wave soldering or Infrared (IR) Reflow is also conventional and need not be further described.

The resultant product is illustrated in FIG. 4.

The reason why the holes in the holed components may have to be blind-holes or closed off at the bottom is to enable the vacuum head to pick-up the component where insufficient solid surface area is available on the component. If a through-hole were present, then the vacuum could not be maintained while the head was over the through-hole and thus the holed component could not be picked up.

Now that holed components are sturdily attached by the SMT to the PCB, the mounting of any electrical components that could ordinarily have been mounted in a PCB with holes to the hole-free PCB 30 is straight forward using all of the well-known previous techniques including pin inserter machines, and pick and place machines. It is of course preferred that the conventional active and passive SMT electrical components, such as capacitors, resistors and transistors still be used wherever possible for the savings in real estate. The holed components are especially important for receiving pins, lugs, sockets, tabs or test points which typically have a large aspect ratio.

Figure 6:
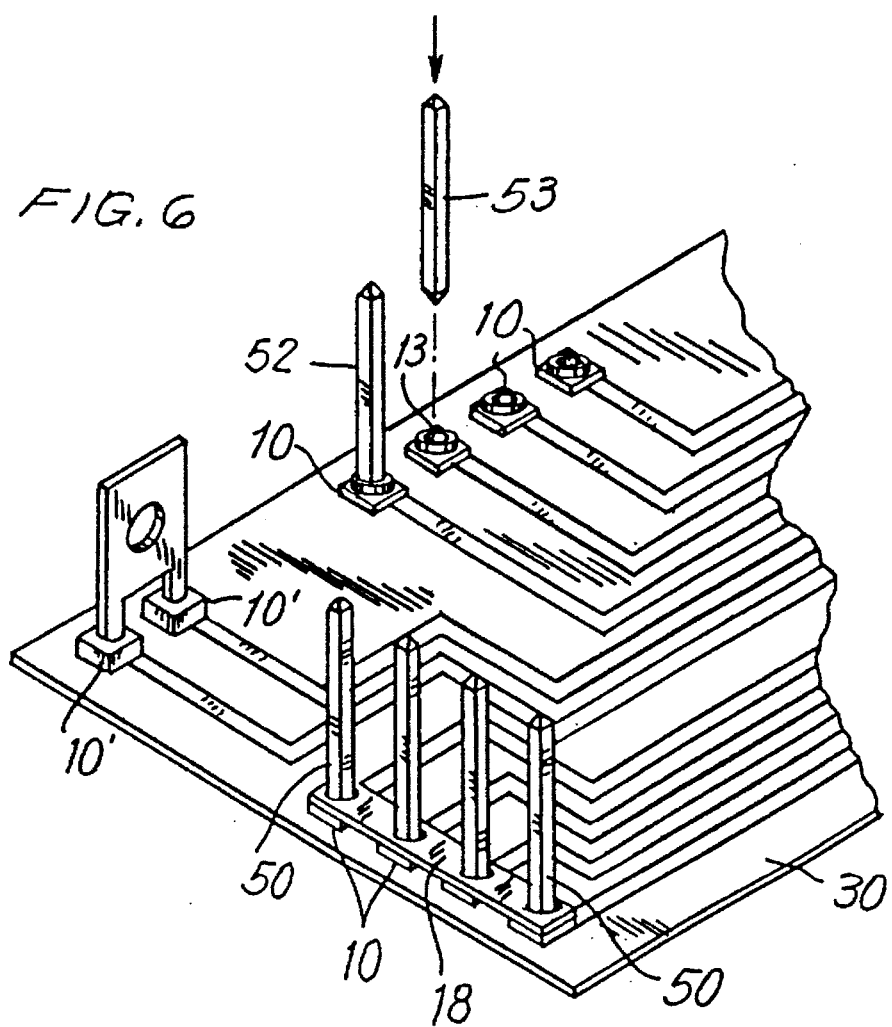
FIG. 6 schematically illustrates pins and tabs being inserted into the soldered holed components on the PCB of FIG. 5.

FIG. 6 shows at the bottom four pins 50 each press-fitted into a hole 13 of one of the holed components 10 of the assembly 18. The array of four pins can be used to receive a female connector. In the upper left is shown a male tab 51 which can serve to mate with a female wire, terminal or equivalent, whose two male prongs are press fitted into two holed components 10'. In the upper right is shown a terminal pin 52 press fitted into the hole of a holed component 10, and next to it is shown a pin 53 in the process of being inserted and press fitted into the hole of the adjacent holed component. Such male components are readily inserted manually or by machine. No further soldering is required of the male projection to the hole, as the press or interference fit produces a remarkably sturdy connection that makes a low resistance, reliable electrical connection. However, if desired, further soldering can be carried out individually or via wave soldering but at a lower reflow temperature than was used for the soldering of the holed components and other SMT components to the PCB before the pins, lugs, etc. were press-fitted into place.

Figure 7A:
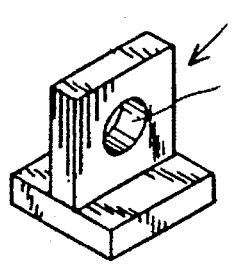
FIGS. 7A and 7B ar perspective views of holed components in accordance with the invention in which the holes are horizontal.
Figure 7B:
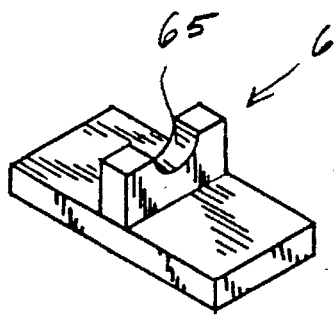

In the previous embodiments, the hole in the holed components extended perpendicularly to the PCB plane. FIGS. 7A and 7B illustrate two other modified holed components 60, 61 which differs from the others in that the hole axis is parallel to the PCB instead of perpendicular. Such holed components can be used to manually mount component pins that extend parallel to the PCB. In the case of the FIG. 7A embodiment, an interference fit can be used to hold the component terminal in place in the through-hole 63. In the FIG. 7B embodiment, a connector can be laid horizontally in the semi-cylindrical hole 65 and individually soldered in place or the component used as a test point.

While the examples given were of metal holed components, it will be appreciated that only the surface bordering the hole and extending down to the solder pad need be electrically conductive, since the basic requirement is that the terminal of the component mounted in the hole makes a good electrical connection to the solder pad. Hence, while all metal is still preferred, holed components constituted of plastic such as epoxy or phenolic, plated with a good electrically conductive metal which extends into the hole as well as all around the base, can also be used.

While not illustrated, for ease of press-fitting the terminal into the hole of the holed component, the hole at its entrance can be beveled to provide a slightly wider lead-in region at the hole opening.

The insulating member 23 can be replaced by a conductive member where the holes are electrically at the same potential, such as when used as a power connector for supplying power to several pin terminals inserted into the holes and wired to different components.

The invention offers the advantage of providing precision mounting holes, on surface mount boards without holes. Because of the low height of these holed components, they can be packaged in tape and reel format and together with a pick and place machine can be positioned onto the surface of the board in the same exact way as all of the other components that will be surface mounted. The holed components are readily manufactured by stamping, and easily assembled in insulated arrays.

While the invention will be used most frequently on hole-free PCBs, there can be applications in which the PCB does have holes for some components, but it is desired to add a pin or similar element to a PCB region free of holes, and the holed component can be added to that hole-free region to provide a reception hole for the pin or similar element.

While the holed component would be employed primarily to receive a terminal, pin, etc. as described, they can also be used as mechanical hold-down means. For example, where the hole is threaded, a screw can be manually driven into the hole with an intervening member bearing against an adjacent component to assist in holding the component on the PCB.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A substrate having spaced solder pads, one or more electrically-conductive holed components each soldered directly to and making electrical contact with a solder pad, said holed components each comprising a body having a blind or through-hole and having a relatively low aspect ratio of about 0.5 or less for receiving and electrically connecting to a separate male projection of an electrical component.

2. The substrate of claim 1, wherein the hole is a blind hole extending perpendicular to a plane of the substrate.

3. The substrate of claim 1, wherein the hole is a through-hole extending parallel to a plane of the substrate.

4. The substrate of claim 1, wherein one of the holed components comprises a body in the shape of a polygon.

5. The substrate of claim 1, wherein the blind or through-hole is completely surrounded at its circumference by electrically-conductive material.

6. A substrate having spaced solder pads, one or more electrically-conductive holed components each soldered directly to and making electrical contact with a solder pad, said holed components each comprising a body having a blind or through-hole for receiving and electrically connecting to a male projection of an electrical component, wherein one of the holed components comprises a washer-shaped member having a solid base with a small upstanding projection containing a blind hole.

7. The substrate of claim 6, further comprising insulating means interconnecting the holed components via their projections.

8. The substrate of claim 6, further comprising electrically conductive means interconnecting the holed components.

9. A hole-free printed circuit board region having spaced solder pads connected to conductive tracks, a plurality of spaced, electrically conductive holed components each directly soldered to one of the solder pads, each holed component having a blind-hole or through-hole extending generally perpendicular to the board, further comprising components having one or more male projections, the male projections being press-fitted into a hole in one of the holed components.

10. The board of claim 9, wherein the largest lateral dimension of a projection exceeds the smallest lateral dimension of the hole by at least about 0.0005 inches.

11. A hole-free printed circuit board region having spaced solder pads connected to conductive tracks, a plurality of spaced, electrically conductive holed components each directly soldered to one of the solder pads, each holed component having a blind-hole or through-hole extending generally perpendicular to the board, wherein the aspect ratio of the holed component is equal to or less than 0.5.

12. The board of claim 11, wherein the component having one or more male projections is a pin, lug, socket, tab or test point.

13. A holed component for soldering to a solder pad of a printed circuit board, said component comprising a body having an electrically-conductive surface and an aspect ratio of 0.5 or less and a blind-hole extending perpendicular to a surface of the body, said surface of the body being solder-tinned.

14. The holed component of claim 13, wherein the body is constituted of a copper-based alloy.

15. A holed component for soldering to a solder pad of a printed circuit board, said component comprising an electrically-conductive body having an aspect ratio of 0.5 or less and a through-hole extending perpendicular to a surface of the body, said surface of the body being solder-tinned and being of a sufficiently large area to receive the pick-up of a pick and place machine.

16. The holed component of claim 15, wherein the body is constituted of a copper-based alloy.

17. A hole-free printed circuit board region having spaced solder pads connected to conductive tracks, a plurality of spaced, electrically conductive holed components each directly soldered to one of the solder pads, each holed component having an accessible blind-hole or through-hole extending generally perpendicular to the board for receiving a separate component.

* * * * *